United States Patent
Keelan

(10) Patent No.: US 8,866,951 B2
(45) Date of Patent: Oct. 21, 2014

(54) SUPER-RESOLUTION IMAGING SYSTEMS

(75) Inventor: Brian Keelan, Boulder Creek, CA (US)

(73) Assignee: Aptina Imaging Corporation, George Town (KY)

( * ) Notice: Subject to any disclaimer, the term of this patent is extended or adjusted under 35 U.S.C. 154(b) by 5 days.

(21) Appl. No.: 13/458,599

(22) Filed: Apr. 27, 2012

(65) Prior Publication Data

US 2013/0050526 A1 Feb. 28, 2013

Related U.S. Application Data

(60) Provisional application No. 61/527,007, filed on Aug. 24, 2011.

(51) Int. Cl.
*H04N 5/225* (2006.01)
*H04N 5/232* (2006.01)

(52) U.S. Cl.
CPC ............ *H04N 5/2254* (2013.01); *H04N 5/232* (2013.01)
USPC ............................. 348/340; 348/335; 348/294

(58) Field of Classification Search
CPC .. H04N 5/2254; H04N 5/23212; H04N 5/335
USPC ................. 348/222.1, 218.1, 219.1, 335, 340
See application file for complete search history.

(56) References Cited

U.S. PATENT DOCUMENTS

| 7,773,143 B2 * | 8/2010 | Feldman et al. ............. 348/340 |
| 2002/0089596 A1 | 7/2002 | Suda |
| 2005/0103983 A1 | 5/2005 | Yamaguchi et al. |
| 2006/0145222 A1 | 7/2006 | Lee |
| 2009/0128672 A1 | 5/2009 | Watanabe |
| 2011/0018086 A1 * | 1/2011 | Linga ............................ 257/438 |
| 2011/0080487 A1 * | 4/2011 | Venkataraman et al. .. 348/218.1 |
| 2012/0147205 A1 * | 6/2012 | Lelescu et al. ............. 348/218.1 |

FOREIGN PATENT DOCUMENTS

| EP | 1339237 | 8/2003 |
| EP | 1475963 | 11/2004 |
| WO | 2005072370 | 8/2008 |

* cited by examiner

*Primary Examiner* — Sinh Tran
*Assistant Examiner* — Zhenzhen Wu
(74) *Attorney, Agent, or Firm* — Treyz Law Group; Louis R. Levenson; David C. Kellogg

(57) ABSTRACT

Electronic devices may include super-resolution imaging systems for capturing multiple relatively low-resolution images and combining the captured images to form a high-resolution image. The imaging system may include image sensors configured to capture information above the Nyquist frequency of the image sensor by providing each image sensor pixel in an array of image sensor pixels with structures for reducing the size of the clear pixel aperture below the size of the image sensor pixel. The structures may be configured to pass light that is incident on a central region of the image sensor pixel to a photo-sensitive element through a color filter element and to reject light that is incident on a surrounding edge region. The structures may include a microlens configured to reject light that is incident on the edge region or a combination of a microlens and masking structures. Masking structures may be absorbing, reflecting, or interfering structures.

10 Claims, 5 Drawing Sheets

SUPER-RESOLUTION IMAGING SYSTEMS

This application claims the benefit of provisional patent application No. 61/527,007, filed Aug. 24, 2011, which is hereby incorporated by reference herein in its entirety.

BACKGROUND

This relates generally to imaging devices, and more particularly, to imaging devices with super-resolution imaging capabilities.

Image sensors are commonly used in electronic devices such as cellular telephones, cameras, and computers to capture images. In a typical arrangement, an electronic device is provided with an image sensor and a corresponding lens for focusing image light onto the image sensor.

In some devices, multiple images are captured and combined into a single output image. For example, several relatively low-resolution images may be combined to form a relatively higher resolution image. The combined high-resolution image is often called a super-resolution image.

A super-resolution image contains information having a spatial frequency that is higher than the limiting (Nyquist) spatial frequency of the low-resolution images. This information is unavailable in each low-resolution image, however it can be recovered by combining multiple low-resolution images.

Conventional image sensors are designed to maximize the image signal-to-noise ratio of image data and to minimize the lateral dimensions and physical volume of the image sensor. However, maximizing the image signal-to-noise ratio of image data and the lateral dimensions and physical volume of the image sensor can limit the amount of available information above the Nyquist frequency that can be recovered when combining multiple images.

It would therefore be desirable to be able to provide imaging devices with improved super-resolution image capture capabilities.

DETAILED DESCRIPTION

Electronic devices such as digital cameras, computers, cellular telephones, and other electronic devices may be provided that include one or more image sensors that gather incoming light to capture an image. Each image sensor may include one or more arrays of image sensor pixels (sensor pixels). Each image sensor pixel in an image sensor pixel array may include one or more photo-sensitive elements and lensing structures configured focus light onto the photo-sensitive elements. The lensing structures may be arranged to collect additional light to be imaged and to reduce potential variations in light collection efficiency for light from various incident angles. The lensing structures may also be configured to reduce the effective aperture size of that sensor pixel to less than the total lateral size of the sensor pixel.

Each image sensor pixel array may have any number of sensor pixels (e.g., hundreds or thousands or more). A typical image sensor may, for example, have an image sensor pixel array with hundreds of thousands or millions of sensor pixels (e.g., megapixels). Image sensors may include control circuitry such as circuitry for operating the image sensor pixels and readout circuitry for reading out image signals corresponding to the electric charge generated by the photo-sensitive elements. Image sensors may be coupled to processing circuitry for processing and combining image frames to form relatively higher resolution (e.g., super-resolution) image frames.

Figure 1:
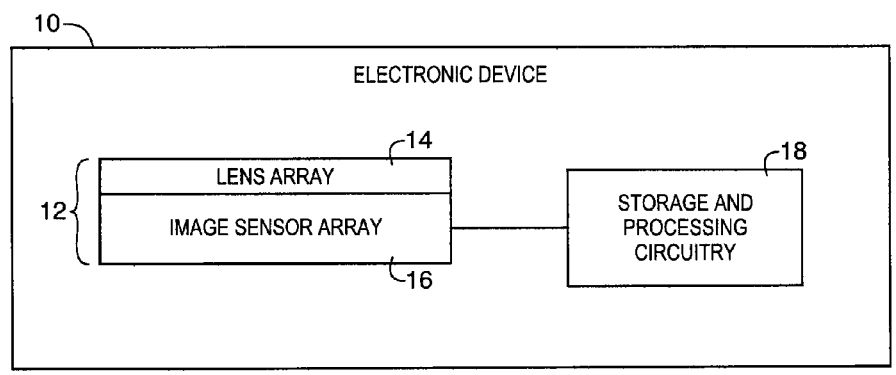
FIG. 1 is a diagram of an illustrative electronic device in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses in lens array 14 and one or more corresponding image sensors in image sensor array 16. During image capture operations, light from a scene may be focused onto an image sensor in image sensor array 16 by a corresponding lens in lens array 14. Image sensor array 16 may provide corresponding digital image data to control circuitry such as storage and processing circuitry 18. Image sensor array 16 may include one image sensor, two image sensors, three image sensors, four image sensors or more than four image sensors. Image light may be focused onto each image sensor by a corresponding lens in lens array 14.

Processing circuitry 18 may include one or more integrated circuits (e.g., image processing circuits, microprocessors, storage devices such as random-access memory and non-volatile memory, etc.) and may be implemented using components that are separate from camera module 12 and/or components that form part of camera module 12 (e.g., circuits that form part of an integrated circuit that includes image sensor array 16 or an integrated circuit within module 12 that is coupled to image sensor array 16). Image data that has been captured by camera module 12 may be processed and stored using processing circuitry 18. Processing circuitry 18 may be used to combine low-resolution images to form high-resolution images, to detect motion in an image, to color-correct images, crop images, or otherwise process image data. Processed image data may, if desired, be provided to external equipment (e.g., a computer or other device) using wired and/or wireless communications paths coupled to processing circuitry 18.

Control circuitry such as control circuitry on a common semiconductor integrated circuit die with image sensor array 16 or control circuitry that is separate from image sensor array 16 (e.g., storage and processing circuitry 18) may be used to combine multiple captured images to form super-resolution images.

Figure 2:
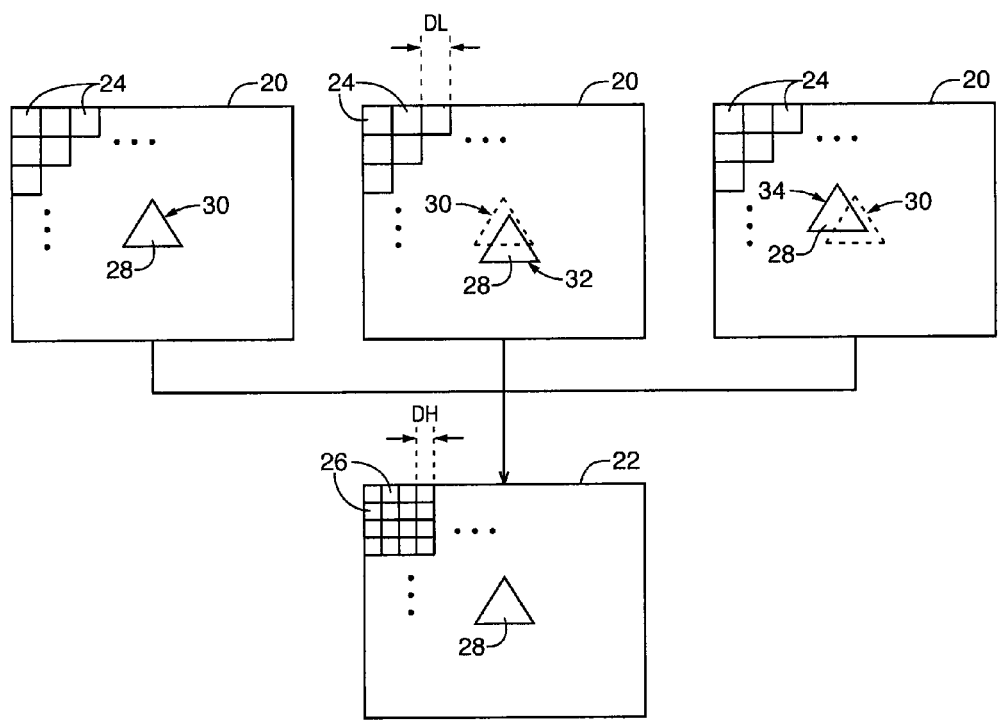
FIG. 2 is a diagram showing an illustrative combination of multiple low-resolution images to form a super-resolution image in accordance with an embodiment of the present invention.

As shown in FIG. 2, multiple low-resolution images such as images 20 may be combined to form relatively higher-resolution images (e.g., super-resolution (SR) images) such as image 22. Low-resolution images 20 may be captured using multiple individual image sensors in image sensor array 16, using multiple image sensor pixel arrays in a single image sensor, or may be captured at different times using a single image sensor pixel array. Low-resolution images 20 may have image pixels 24 having a lateral size DL. Image pixels 24 may, for example, be substantially square image pixels having orthogonal lateral dimensions that are both equal to DL. Image pixels 24 may include image data captured by a corresponding image sensor pixel in an image sensor pixel array.

SR image 22 may have image pixels 26 with a pixel size DH (e.g., a lateral pixel width DH) that is smaller than pixel size DL of image pixels 24 in images 20. Super-resolution image 22 may be formed, for example, by determining the relative positions of image pixels 24 in each low-resolution image and interpolating the image data corresponding to those image pixel values onto a grid of pixel positions associated with image pixels 26 of high-resolution image 22. The relative positions of image pixels 24 in low-resolution images 20 may be determined using knowledge of the relative positions of image sensor pixels in multiple image sensor pixel arrays or by detecting relative positions of features in each image 20 (as examples).

For example, each image 20 may include images of one or more objects such as object 28. An object such as object 28 may appear in a first low-resolution image at a position 30, in a second low-resolution image 20 at a second position 32, and in a third low-resolution image 20 at a third position 34. In situations in which images 20 are captured at different times using a single image sensor pixel array, the relative positions 30, 32, and 34 of object 28 in images 20 may be different due to motion of the imaging system during image capture operations or due to repositioning of camera module components during imaging operations (e.g., toggling an image sensor among various pre-determined positions during image capture operations). In situations in which images 20 are captured using multiple image sensor pixel arrays, the relative positions 30, 32, and 34 of object 28 in images 20 may be different due to differing fields-of-view of the multiple image sensor pixel arrays. The relative positions 30, 32, and 34 of object 28 in images 20 may be detected using circuitry 18 or other circuitry associated with image sensor array 16 by detecting edges, sharpness peaks, or other features of imaged objects.

The detected positions of object 28 may be used to register the relative positions of image pixels 24 in images 20. The registered relative positions of image pixels 24 may be used in generating image pixel values for image pixels 26 of SR image 22. The example of FIG. 2 in which three low-resolution images are combined to form a super-resolution image is merely illustrative. Any number of low-resolution images may be used to form a super-resolution image.

Figure 3:
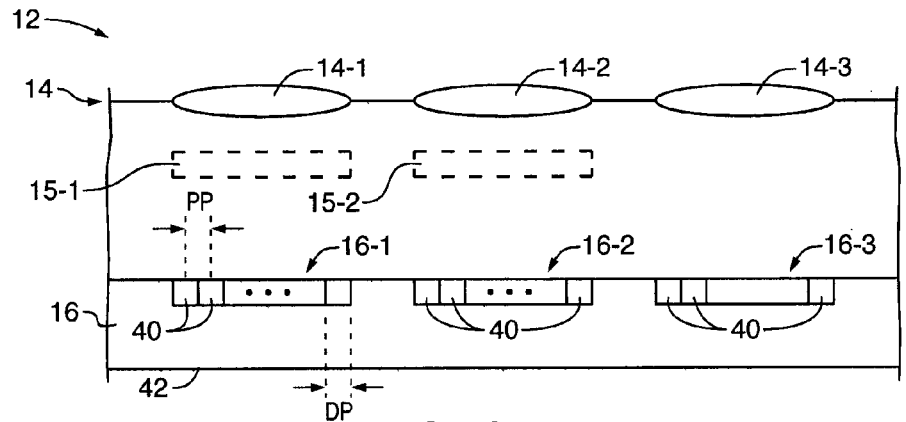
FIG. 3 is a cross-sectional side view of a portion of an illustrative camera module having multiple image sensors and multiple corresponding lenses in accordance with an embodiment of the present invention.

The cross-sectional side view of camera module 12 in FIG. 3 shows how each image sensor in image sensor array 16 may have an associated lens in lens array 14. In the example of FIG. 3, image sensors 16-1, 16-2, and 16-3 each have an array of image sensor pixels 40 formed on a substrate such as substrate 42. Substrate 42 may, for example, be a silicon semiconductor substrate. The image sensor pixels 40 of image sensors 16-1, 16-2, and 16-3 may receive image light respectively through lenses 14-1, 14-2, and 14-3. Each image sensor pixel 40 may have a lateral size DP (e.g., a lateral width) and be spaced at a distance PP from adjacent image sensor pixels 40. The relative center-to-center distance PP of adjacent image sensor pixels 40 may be referred to as the pixel pitch.

If desired, each image sensor pixel 40 in an image sensor pixel array may be used to generate an image pixel value such as image pixel values 24 of low-resolution images 20. The image pixel values generated by image sensors 16-1, 16-2, and 16-3 may be combined to form a high-resolution image such as SR image 22 as described above in connection with FIG. 2.

If desired, camera module 20 may be provided with additional color filters 15 (e.g., color filters 15-1 and 15-2). Color filters 15 may, for example, be single color filters (e.g., red color filters, blue color filters, green color filters, etc.) for making each image sensor a single color image sensor. In this way, each image sensor pixel array may be used to capture image data of a single color to be combined to form a color image having higher resolution (i.e., SR image 22 may be a high-resolution color image formed from several single color images 20). However, this is merely illustrative. If desired, camera module 12 may be provided without color filters 15. In configurations in which camera module 12 may be provided without color filters 15, each image sensor pixel 40 may be provided with color filter structures such as individual color filter elements.

The example described above in connection with FIG. 3 in which SR image 22 is formed by combining images 20 captured using separate individual image sensors 16-i is merely illustrative. If desired, multiple sequentially captured image frames from a single image pixel array (e.g., image frames captured during video capture operations) may be combined to form a high-resolution image such as SR image 22 as shown in FIG. 4.

Figure 4:
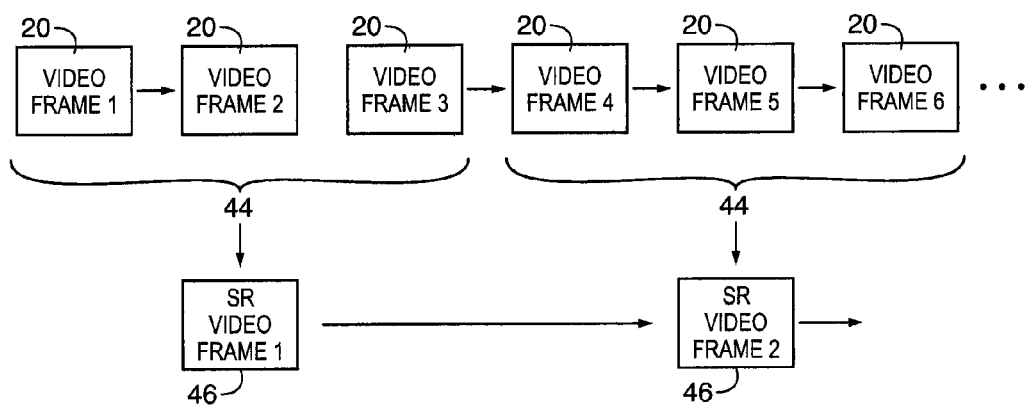
FIG. 4 is a diagram showing an illustrative combination of multiple low-resolution video image frames to form super-resolution video image frames in accordance with an embodiment of the present invention.

In the example of FIG. 4, sequentially captured video frames (e.g., video frame 1, video frame 2, video frame 3, video frame 4, video frame 5, video frame 6, etc.) may each form a low-resolution image 20. Sets of multiple video image frames such as sets 44 video image frames 20 may be combined to form super-resolution (SR) video frames 46. Each set 44 of video image frames may include two video image frames, three video image frames, four video image frames or more than four video image frames.

Super-resolution imaging operations can help increase the resolving power of an imaging system above that of the resolving power of an individual image sensor pixel array. An increase in resolving power of this type uses information in low-resolution images having a spatial frequency that is above the Nyquist frequency of the low-resolution images.

This high spatial frequency information is commonly aliased in a single low-resolution image, but can be recovered from multiple low-resolution images if certain conditions are met. The amount of information "above-Nyquist" (i.e., information having a spatial frequency higher than the Nyquist frequency of the image) is limited by the modulation transfer functions (MTFs) of the lens and pixel aperture used in capturing the low-resolution image. Super-resolution imaging capability may therefore be enhanced with respect to conventional image sensors by providing image sensors with a decreased pixel fill factor FF (e.g., using microlenses or other lensing structures) or by increasing the pixel size DP (or pixel pitch PP) with respect to the lens of the image sensor. Decreasing the pixel fill factor FF results in a light-sensitive area of each image sensor pixel that is smaller than the pixel size, thereby broadening the pixel aperture MTF. Increasing the pixel size results in a sampling of the lens MTF at lower frequencies, thereby improving the lens bandpass relative to the image sensor Nyquist frequency. A decreased fill factor and/or an increased pixel pitch may help increase the signal content above Nyquist, thereby enhancing the super-resolution imaging capabilities of a camera module.

Because only content above the image sensor Nyquist frequency enables super-resolution processing to increase resolving power, the MTF of an imaging system up to the point of digital sampling determines the amount of available information above Nyquist. Although some components of the signal chain after the sampling stage do differ, the overall post-sampling MTFs of conventional and SR systems should be similar. Hence, it is sufficient to discuss the pre-sampling MTFs to describe the potential performance of enhanced super-resolution imaging systems.

The pre-sampling modulation transfer function $MTF_{sys}$ of an imaging system has three primary component MTFs, arising from the lens, the image sensor pixel aperture, and crosstalk between image sensor pixels as described in the following equation:

$$MTP_{sys}(v_p) = MTF_l(v_p f/PP) \times MTF_a(v_p \times FF) \times MTF_x(v_p/PP), \quad (1)$$

where $MTF_l$, $MTF_a$, and $MTF_x$ respectively represent the modulation transfer functions of the lens, the image sensor pixel aperture and the pixel cross talk, f is the equivalent diffraction-limited f-number of the lens, FF is the image sensor pixel fill factor, PP is the image sensor pixel pitch, and $v_p$ is the spatial frequency of information in cycles per pixel (in which space the Nyquist frequency=½). Equation 1 shows only the dependency of each modulation transfer function on the relevant adjustable parameters (f, PP, and FF) (e.g., $MTF_a$ at frequency $v_p$ is a function of frequency $v_p$ multiplied by fill factor FF). As described above and as indicated by equation 1, the system MTF may be increased (and the super-resolution capabilities enhanced) by increasing the sensor pixel pitch PP and/or by decreasing the sensor pixel fill factor FF.

Figure 5:
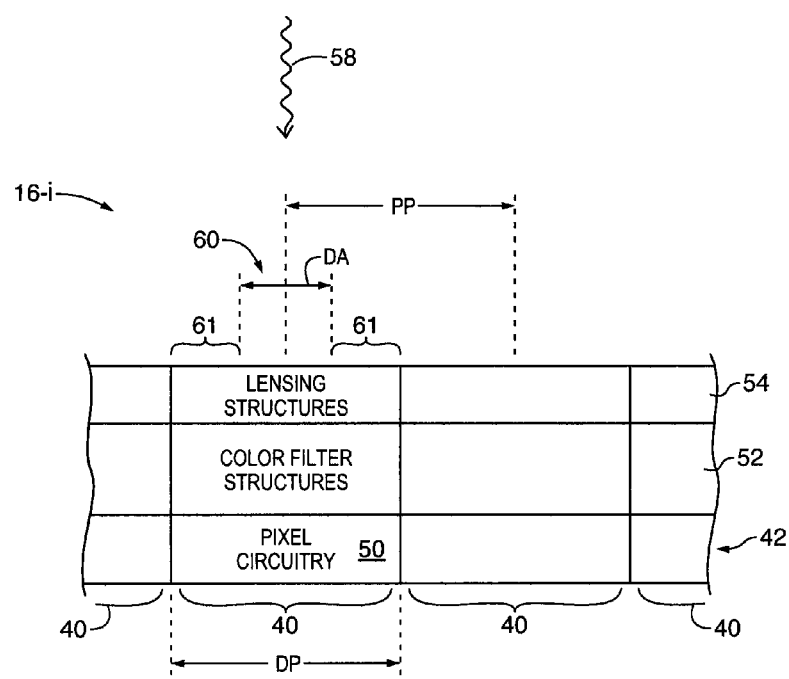
FIG. 5 is a cross-sectional side view of a portion of an array of image sensor pixels each having structures configured to set the effective aperture of the image sensor pixels in accordance with an embodiment of the present invention.

FIG. 5 is a cross-sectional side view of a portion of a sensor pixel array showing how the effective sensor pixel aperture size of each image sensor pixel may be set using aperture-defining and lensing structures associated with each image sensor pixel. As shown in FIG. 5, each image sensor pixel 40 of an image sensor 16-i may include pixel circuitry 50. Pixel circuitry 50 may include circuitry such as photodiodes, charge storage regions, transistors such as source-follower transistors, reset transistors, row-select transistors, and other circuitry for operating image sensor pixels 40 to capture image data. Pixel circuitry 50 in each image sensor pixel 40 may be formed in a substrate such as substrate 42. Each image sensor pixel 40 may include color filter structures 52 formed on a surface of substrate 42. For example, color filter structures 52 may include red color filter elements, green color filter elements, blue color filter elements, infrared color filter elements, etc. Color filter structures 52 may form an array of color filter elements having a color filter element of a single color over pixel circuitry 50 of each image sensor pixel 40. However, this is merely illustrative. If desired, lensing structures 54 may be formed on a surface of substrate 42 without any interposing color filter structures.

As shown in FIG. 5, each image sensor pixel 40 may include structures such as aperture-defining and lensing structures 54 (sometimes referred to herein simply as lensing structures). Lensing structures 54 of each image sensor pixel 40 may be configured to reject incident light 58 near edges regions 61 of that image sensor pixel 40 and to transmit light 58 that is incident on the image sensor pixel near the center of that image sensor pixel 40. In this way, each image sensor pixel 40 may be provided with an effective clear aperture 60 having a central light-sensitive portion with a lateral aperture size DA (e.g., a lateral width) that is smaller than the lateral size DP of that image sensor pixel. The sensor pixel fill factor FF may be equal to the ratio of effective aperture size DA to pixel size DP.

Lensing structures 54 may include structures such as microlenses and masking structures for providing sensor pixel 40 with an effective clear aperture 60 having a central light-sensitive portion with a lateral aperture size DA (e.g., a lateral width) that is smaller than the lateral size DP of that image sensor pixel. Lensing structures 54 may, for example, include sharp-edged masking structures (e.g., a patterned reflective mask) with openings that define an aperture with an abrupt edge having a width DA. However, this is merely illustrative. If desired, lensing structures 54 may be arranged to form an apodized aperture in which a transmissive center region of the lensing structures gradually transitions into an increasingly opaque edge region of the lensing structures. In this type of configuration, the effective aperture size DA of pixel 40 may be equal to the width (or area) of the region of lensing structures 54 that transmits (passes) a percentage of incident light greater than 50 percent, greater than 80 percent, greater than 90 percent, greater than 30 percent, greater than 20 percent or greater than 99 percent (as examples).

Figure 6:
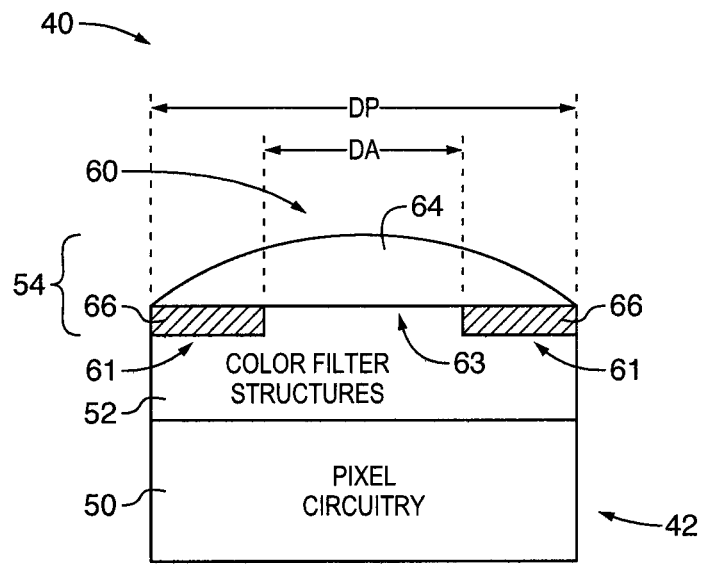
FIG. 6 is a cross-sectional side view of an image sensor pixel showing how a structure of the type shown in FIG. 5 may be implemented as a gapless microlens with a masking structure interposed between the microlens and a color filter element in accordance with an embodiment of the present invention.

FIG. 6 is a cross-sectional side view of an image sensor pixel showing how structures 54 may be implemented a microlens such as microlens 64 and pixel aperture masking structures such as masking structures 66. As shown in FIG. 6, masking structures 66 may be interposed between a color filter element 52 and microlens 64 in edge regions 61 of sensor pixel 40. Masking structures 66 may be partially or completely embedded in color filter structures 52, may be partially or completely embedded in microlens 64, may be formed on an outer surface of color filter structures 52 or may be formed on a surface of substrate 42 without any intervening color filter structures. Masking structures 66 of each sensor pixel 40 may include an such as opening 63 in a central portion of sensor pixel 40 for allowing light to pass through opening 63 and through color filter structures 62 onto pixel circuitry 50.

Masking structures 66 may be formed from metal or other opaque material, light-absorbing material, light-reflecting material, light-interfering structures arranged to generate interference for rejecting image light, or other suitable structures for providing sensor pixel 40 with a clear aperture 60 having an effective aperture size DA that is smaller than pixel size DP of that pixel. During manufacturing of device 10, masking structures 66 and lens 64 may be formed on image sensor pixels 40 by providing masking material over color filter elements 52, forming (e.g., etching) openings 63 in the masking material and forming microlenses 64 over the etched masking material. Masking structures 66 may be a patterned metal masking structure, an absorbing mask structure or other light rejecting structure with an opening for passing light in the central region of the sensor pixel.

Lensing structures 54 may include a microlens such as gapless microlens 64. However, this is merely illustrative. If desired, lensing structures 54 may be implemented as a "pin-cushion" microlens (e.g., a microlens having a rounded upper surface over a substantially rectilinear base) as shown in FIG. 7.

Figure 7:
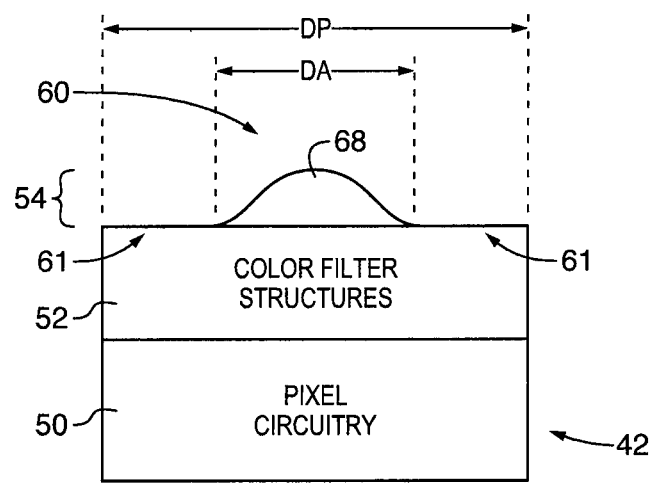
FIG. 7 is a cross-sectional side view of an image sensor pixel showing how a structure of the type shown in FIG. 5 may be implemented as a pin-cushion microlens having a shape configured to reduce the effective aperture of the image sensor pixel in accordance with an embodiment of the present invention.

As shown in FIG. 7, lensing structures 54 may include a microlens 68 that is substantially free of masking material. Microlens 68 may be a "pin-cushion" microlens having a size and shape that is configured to provide sensor pixel 40 with a clear aperture 60 having an aperture size DA that is smaller than pixel size DP of that pixel by passing light in a central region and by rejecting light in a surrounding edge region. Microlens 68 may have a rounded portion in the central region and a substantially planar portion in surrounding edge region 61. Microlens 68 may be formed on a surface of color filter structures 52 formed on substrate 42 or may be formed on a surface of substrate 42 without any intervening color filter structures.

Figure 8:
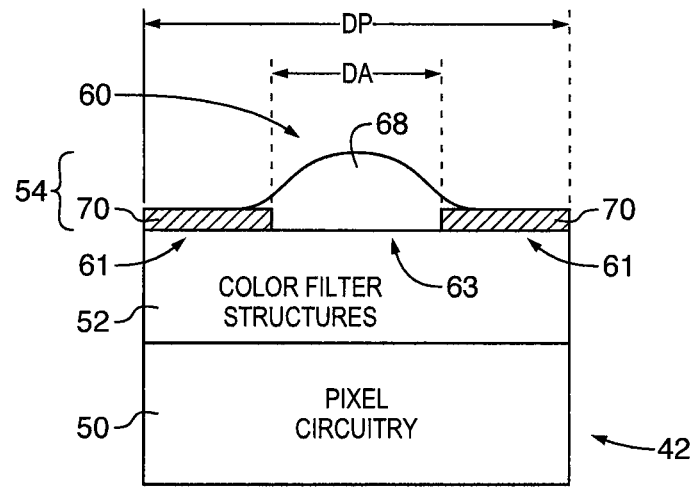
FIG. 8 is a cross-sectional side view of an image sensor pixel showing how a structure of the type shown in FIG. 5 may be implemented as a pin-cushion microlens and a masking structure surrounding a raised portion of the microlens in accordance with an embodiment of the present invention.

If desired, each image sensor pixel 40 may be provided with masking structures such as structures 70 in edge regions 61 in addition to a pin-cushion microlens having a size and shape that is configured to provide sensor pixel 40 with a clear aperture 60 having an aperture size DA that is smaller than pixel size DP of that pixel as shown in FIG. 8.

In the example of FIG. 8, structures 54 of each sensor pixel 40 are implemented as a microlens 68 formed on a surface of color filter structures 52 in a central portion of image sensor pixel 40 and masking structures 70 in edge portions 61 of sensor pixel 40. Masking structures 70 may be formed on the surface of color filter structures 52. However, this is merely illustrative. If desired, masking structures 70 and/or microlens 68 may be formed on a surface of substrate 42 without any intervening color filter structures.

Microlens 68 may substantially fill openings such as opening 63 in masking structures 70. As shown in FIG. 8, a portion of microlens 68 may be formed over some or all of masking structures 70. Masking structures 70 may be formed from metal or other opaque material, light-absorbing material, light-reflecting material, light-interfering structures arranged to generate interference for rejecting image light, or other suitable structures for providing sensor pixel 40 with a clear aperture 60 having an aperture size DA that is smaller than pixel size DP of that pixel. During manufacturing of device 10, masking structures 70 and lens 68 may be formed on image sensor pixels 40 by, for example, forming masking material over color filter structures 52, forming openings 63 in the masking material, and forming microlenses 68 in the openings.

The arrangement of FIG. 8 in which a portion of microlens 68 is formed over a portion of masking structures 70 is merely illustrative. If desired, microlens 68 may be formed in opening 63 without any portion over masking structures 70 or a portion of masking structures 70 may be formed over a portion of microlens 68 (e.g., by forming microlens 68 on color filter structures 52 and providing masking material over a portion of microlens 68 and in edge regions 61).

Figure 9:
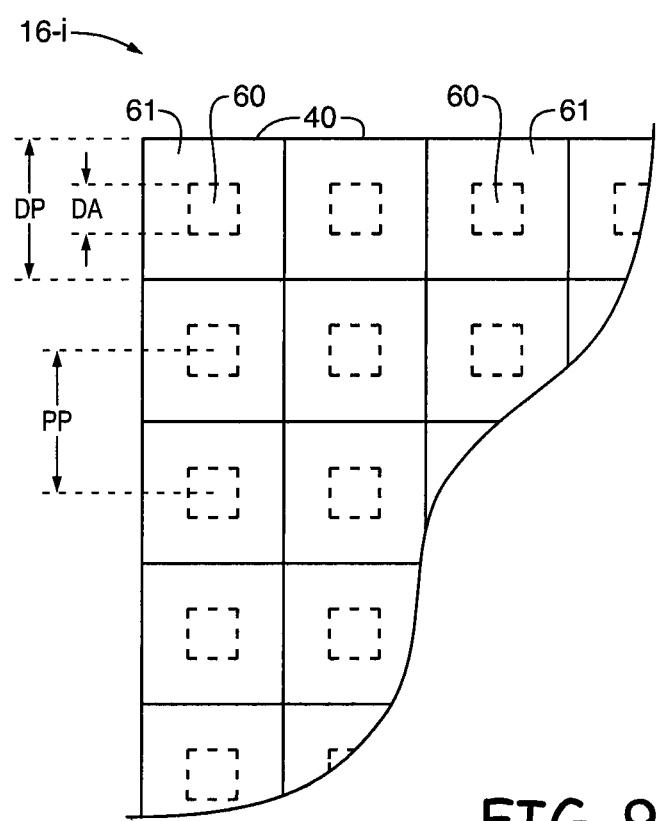
FIG. 9 is a top view of a portion of an illustrative image sensor pixel array having image sensor pixels each with an effective aperture that is smaller than the size of the image sensor pixel in accordance with an embodiment of the present invention.

FIG. 9 is a top view of a portion of an image sensor such as image sensor 16-*i* showing how an image sensor may be provided with an array of image sensor pixels 40 each having a light-sensitive area 60 with a size DA that is smaller than the size DP of that sensor pixel. In the example of FIG. 9, each image sensor pixel 40 includes a clear aperture 60 having a substantially square shape. However, this is merely illustrative. If desired light-sensitive areas 60 may have a circular or other rounded shape. For example, apertures 60 may be circular apertures having a diameter DA that is smaller that the lateral size DP. Edge portions 61 of sensor pixels 40 may be configured to reject incoming light (e.g., using an array of aperture-defining and lensing structures formed over a color filter array on a sensor pixel array substrate). In this way, image sensor 16-*i* may be provided with a pixel pitch PP that is substantially larger than the size DA of light sensitive area 60 of each image sensor pixel 40. As examples, pixel pitch PP may be between 1 μm and 3 μm, between 2 μm and 3 μm, between 2.3 μm and 2.5 μm, between 0.5 μm and 4 μm, less than 3 μm, more than 0.1 μm, or more than 2 μm. Sensor pixel fill factor FF (e.g., FF=DA/DP) may, as examples, be between 0.5 and 0.9, between 0.6 and 0.8, between 0.68 and 0.72, between 0.5 and 0.99, greater than 0.2 or less than 0.9.

Various embodiments have been described illustrating super-resolution imaging systems that provide enhanced super-resolution imaging capabilities by increasing the pre-sampling modulation transfer function of the imaging system. A camera module may include storage and processing circuitry coupled to one, two, three or more image sensors each having at least one array of image sensor pixels. Each image sensor pixel in an array of image sensor pixels may have given lateral size and may be provided with structures configured to form a clear aperture with a lateral aperture size for that image sensor pixel. The lateral aperture size of the clear aperture of that image sensor pixel may be configured to be smaller than the lateral size of that image sensor pixel using the structures. In this way, the pre-sampling modulation transfer function of the imaging system may be increased, thereby helping increase the amount of information available for forming a high-resolution image (e.g., the amount of information having spatial frequencies higher than the Nyquist frequency of the image sensor).

A camera module may include at least one lens for focusing light onto the at least one image sensor. The storage and processing circuitry may be configured to receive a plurality of images captured using the camera module and to combine the plurality of captured images to form a combined image with a resolution that is higher than the resolution of the captured images. The camera module may be configured to capture the plurality of images at different times using a common array of image sensor pixels or the camera module may be configured to capture the plurality of images at a common time using multiple arrays of image sensor pixels (e.g. multiple arrays of image sensor pixels on an common image sensor integrated circuit die).

The structures configured to set the clear aperture for each image sensor pixel may comprise lensing structures. The lensing structures may include at least a microlens and, if desired, additional masking structures. The lensing structures may be configured to pass light that is incident on a central region of the lensing structures onto a photo-sensitive element through a color filter element and to reject light that is incident on a surrounding edge region of the lensing structures.

In one suitable configuration, the lensing structures may include a microlens configured to focus the light onto the photo-sensitive element through the color filter element and a masking structure interposed between the microlens and the color filter element in the surrounding edge region.

In another suitable configuration, the lensing structures may include a pin-cushion microlens having a rounded portion in the central region of the lensing structures and planar portion in the surrounding edge region of the lensing structures. If desired, the lensing structures may further include a masking structure that is formed over the planar portion of the pin-cushion microlens in the surrounding edge region or between the color filter element and the planar portion of the pin-cushion microlens in the surrounding edge region.

Masking structures may include light-reflecting structures (e.g., patterned metal masking structures) or light-absorbing structures having openings in central regions of the lensing structures for allowing light to pass through the openings onto the photo-sensitive elements. If desired, the masking structures may include light-interfering structures configured to generate interference for rejecting the light that is incident on the edge regions of the image sensor pixels.

The foregoing is merely illustrative of the principles of this invention which can be practiced in other embodiments.

What is claimed is:

1. An image sensor pixel, comprising:
   a photo-sensitive element formed in a substrate, wherein the photo-sensitive element is configured to convert light into electric charge;
   lensing structures having a transmissive central region, surrounding opaque edge regions, and a transition region between the center and edge regions in which the lensing structures gradually transition from being transmissive to being opaque such that the lensing structures are configured to pass a first portion of the light that is incident on the central region of the lensing structures onto the photo-sensitive element, to reject a second portion of the light that is incident on the surrounding edge regions of the lensing structures, and to partially pass and partially reject a third portion of the light that is incident on the transition region.

2. The image sensor pixel defined in claim 1 wherein the lensing structures comprise:
   a microlens configured to focus the light onto the photo-sensitive element; and
   a masking structure interposed between the microlens and the substrate in the surrounding edge region of the lensing structures.

3. The image sensor pixel defined in claim 2 wherein the masking structure comprises a patterned metal masking structure having an opening in the central region of the lensing structures for allowing the first portion of the light to pass through the opening.

4. The image sensor pixel defined in claim 2 wherein the masking structure comprises light absorbing material formed in the surrounding edge region.

5. The image sensor pixel defined in claim 2 wherein the masking structure comprises light-interfering structures configured to generate interference for rejecting the second portion of the light.

6. The image sensor pixel defined in claim 2, further comprising:
   a color filter element interposed between the substrate and the lensing structures, wherein the lensing structures are configured to pass the first portion of the light that is incident on the central region of the lensing structures onto the photo-sensitive element through the color filter element.

7. The image sensor pixel defined in claim 2 wherein the masking structure is formed on a surface of the substrate.

8. The image sensor pixel defined in claim 1 wherein the lensing structures comprise a microlens having a size and a shape that are configured to focus the first portion of the light onto the photo-sensitive element and to reject the second portion of the light.

9. The image sensor pixel defined in claim 8 wherein the lensing structures further comprise a masking structure in the surrounding edge region.

10. The image sensor pixel defined in claim 1 wherein the photo-sensitive element comprises a photodiode.

* * * * *